United States Patent
Okyay et al.

(10) Patent No.: US 8,013,659 B2
(45) Date of Patent: Sep. 6, 2011

(54) PROGRAMMABLE SIGNAL ROUTING

(75) Inventors: Aysel Yildiz Okyay, Istanbul (TR); Tugba Demirci, Istanbul (TR); Gregory Jon Richmond, Cupertino, CA (US)

(73) Assignee: Silicon Labs Spectra, Inc., Sunnyvale, CA (US)

( * ) Notice: Subject to any disclaimer, the term of this patent is extended or adjusted under 35 U.S.C. 154(b) by 0 days.

(21) Appl. No.: 12/421,667

(22) Filed: Apr. 10, 2009

(65) Prior Publication Data

US 2009/0256620 A1 Oct. 15, 2009

Related U.S. Application Data

(60) Provisional application No. 61/043,859, filed on Apr. 10, 2008.

(51) Int. Cl.
*H03K 17/00* (2006.01)
(52) U.S. Cl. .......................................... 327/403; 327/99
(58) Field of Classification Search .................. 327/99, 327/291, 293, 294, 296, 298, 403–405, 407–408, 327/564–566; 326/102, 106, 113
See application file for complete search history.

(56) References Cited

U.S. PATENT DOCUMENTS

| | | | | |
|---|---|---|---|---|
| 5,625,303 A | * | 4/1997 | Jamshidi | 326/106 |
| 5,789,966 A | * | 8/1998 | Bechade | 327/407 |
| 7,466,165 B1 | * | 12/2008 | Chiang et al. | 326/113 |

\* cited by examiner

*Primary Examiner* — An T Luu
(74) *Attorney, Agent, or Firm* — Zagorin O'Brien Graham LLP

(57) ABSTRACT

A distributed signal multiplexer circuit programmably routes electronic signals. The circuit includes at least two distributor subcircuits. Each distributor subcircuit is configured to connect an input port to an output port through a switch, with a state of each switch being controlled by information received at a control port. The first and second distributor subcircuits are part of a first and second power domain, respectively. The distributed multiplexer circuit also includes an aggregator subcircuit. The aggregator subcircuit is configured to have a first input port connected with the output port of the first distributor subcircuit, a second input port connected to the output port of the second distributor subcircuit, and the output port signal being a signal selected from among the signals received at the input ports of the distributor subcircuits.

22 Claims, 7 Drawing Sheets

PROGRAMMABLE SIGNAL ROUTING

CROSS-REFERENCES TO RELATED APPLICATIONS

This application claims the benefit of U.S. Provisional Application No. 61/043,859, filed Apr. 10, 2008, which is incorporated herein by reference in its entirety for all purposes.

BACKGROUND OF THE INVENTION

Embodiments of the present invention relate to circuits in general, and, in particular, to the routing of signals within circuits.

One of the critical factors for success in the design and development of integrated circuits is the ability to adapt to new functional requirements in next generation electronic products quickly. Additionally, it is useful if circuits can be reconfigured quickly to meet future design requirements. Previously, reconfigurable architectures included masked ROM, gate-arrays and analog arrays where logic, memory content, or interconnects could be changed by modifying certain process layers, typically the metal interconnect layers.

The introduction of non-volatile programming technology such as Electrically Programmable Read-Only Memory, EPROM, Electrically Erasable Programmable Read-Only Memory, EEPROM, and One-Time-Programmable (OTP) memory, allowed this reconfiguration to be done through electrical programming rather than through wafer fabrication and corresponding reticle changes. Such electrical programmability requires the use of passive switches, active switches, or both to reconfigure signal paths. Typically, the power and ground to the switches are not programmable. In some instances, this may be due to a substantially lower impedance requirement for power supply routing compared to the impedance of a programmable switch element. Therefore, various noise parameters may be introduced on these power supplies with their low impedance connections. The noise characteristics introduced may depend on which signals route through the switches connected to the power supply. In the case where multiple switches exist on a single power supply, noise may be coupled from one signal to another through the switches. Therefore, it may become important to find ways to minimize coupled noise. This may be especially true for clock circuits which may benefit from clean signal paths for clean signal propagation free from noise contamination by other signals.

BRIEF SUMMARY OF THE INVENTION

Devices, systems, and methods are described for a novel programmable signal routing architecture. A distributed multiplexer circuit to programmably route electronic signals may reduce the noise coupled between signals by using separate power domains for various components of the routing architecture.

One embodiment of the invention is a distributed signal multiplexer circuit to programmably route electronic signals. The circuit includes a first distributor subcircuit. The first distributor subcircuit includes an input port, an output port, a switch, and a control port. The first distributor subcircuit is configured to connect the input port to the output port through the switch, with a state of the switch being controlled by information received at the control port. The first distributor subcircuit is part of a first power domain. The distributed multiplexer circuit also includes a second distributor subcircuit, that includes an input port, an output port, a switch, and a control port. The first distributor subcircuit is configured to connect the input port to the output port through the switch, with a state of the switch being controlled by information received at the control port. The second distributor subcircuit is part of a second power domain. The distributed multiplexer circuit also includes an aggregator subcircuit. The aggregator subcircuit includes a first input port, a second input port, an output port, and a selector device. The aggregator subcircuit is configured to have the first input port communicatively coupled with the output port of the first distributor subcircuit, the second input port connected to the output port of the second distributor subcircuit, and the output port signal being a signal selected from among the signals received at the input ports of the first distributor subcircuit and the input ports of the second distributor subcircuit.

In some embodiments of the invention, a signal source that generates the first signal input to the input port of the first distributor is part of the first power domain, and a signal source that generates the second signal input to the input port of the second distributor is part of the second power domain. In some embodiments, the aggregator subcircuit is part of a third power domain isolated from the first power domain and the second power domain. In some embodiments, a clock signal is input to the input port of the first distributor module. In some embodiments, a signal divider circuit is present. The signal divider circuit includes an input port, an output port, and is configured to reduce a clock rate of an input signal received at the input port, and output a reduced clock rate signal at the output port.

In another embodiment of the invention, a distributed multiplexer circuit includes a first switching module. The first switching module includes a reference clock input port, a first reference clock output port, a second reference clock output port, a first switch, a second switch, and a switch control port. The first switching module is configured to have the reference clock input port connected to the first output port via the first switch, the reference clock input port connected to the second reference clock output port via the second switch. Also, each switch is in either an open or closed state depending on a signal received at the control port. The first switching module is part of a first power domain. The distributed multiplexer circuit also includes a second switching module. The second switching module includes a reference clock input port, a first reference clock output port, a second reference clock output port, a first switch, a second switch, and a switch control port. The second switching module is configured to have the reference clock input port connected to the first output port via the first switch, the reference clock input port connected to the second reference clock output port via the second switch. Also, each switch is in either an open or closed state depending on a signal received at the control port. The second switching module is part of a second power domain. The distributed multiplexer circuit also has a first aggregator module. The first aggregator module includes a first input port, a second input port, an output port, and circuitry to output a single signal from among the signals received at the input ports. The first aggregator configured to have the first input port coupled with the first output port of the first switching module, and the second input port coupled with the first output port of the second switching module. The distributed multiplexer circuit also includes a second aggregator module. The second aggregator module includes a first input port, a second input port, an output port, and circuitry to output a single signal from among the signals received at the input ports. The second aggregator configured to have the first input port coupled with the second output port of the first switching module, and the second input port coupled with the second output port of the second switching module.

In another embodiment of the invention, a programmable clock routing circuit on an integrated circuit chip is present. The circuit includes a first and second signal multiplexer. Each signal multiplexer includes a reference clock input port, at least three output ports, at least three switches, and a control logic input. The first and second signal multiplexers are in the first and second power domains, respectively. Each input port is connected to an output port through a switch, with each switch being opened or closed according to the signals received at the corresponding control port. The circuit also includes a first and second signal aggregator. Each aggregator includes a first input port, at least a second input port, an output port, and circuitry to combine signals received on the input ports to one output signal on the output port. Each signal aggregator is configured to have its input ports connected to each signal multiplexer. The first signal aggregator and the second signal aggregator are part of a third power domain. The circuit also includes first and second phase-locked loop modules. Each phase-locked loop module includes an input port, an output port, and circuitry to increase the frequency of a signal received on the input port and output a signal of increased frequency on the output port. Each phase-locked loop module is configured to be an aggregator. The first and second phase-locked loop are part of a fourth and fifth power domain, respectively. The circuit also includes a third and fourth switching module. Each of these switching modules include an input port, a first output port, a second output port, a first switch, a second switch, and a control port. Each switching module is configured to have the input port connected to the first output port through the first switch, the input port connect to the second output port through the second switch. The state of each switch is controlled by information received via the control port, and the input port coupled to the output of a phase-locked loop module. The third and fourth switching modules are part of a fourth and fifth power domain, respectively. The circuit also includes a third and fourth signal aggregator modules. Each aggregator module includes a first input port, at least a second input port, an output port, and circuitry to combine signals received on the input ports to one output signal on the output port. Each of these signal aggregator modules is configured to have the first input port coupled with an output port of a signal multiplexer and to have the second input port coupled with an output port of another signal multiplexer. The third and fourth signal aggregator are part of the third power domain.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

Figure 1:
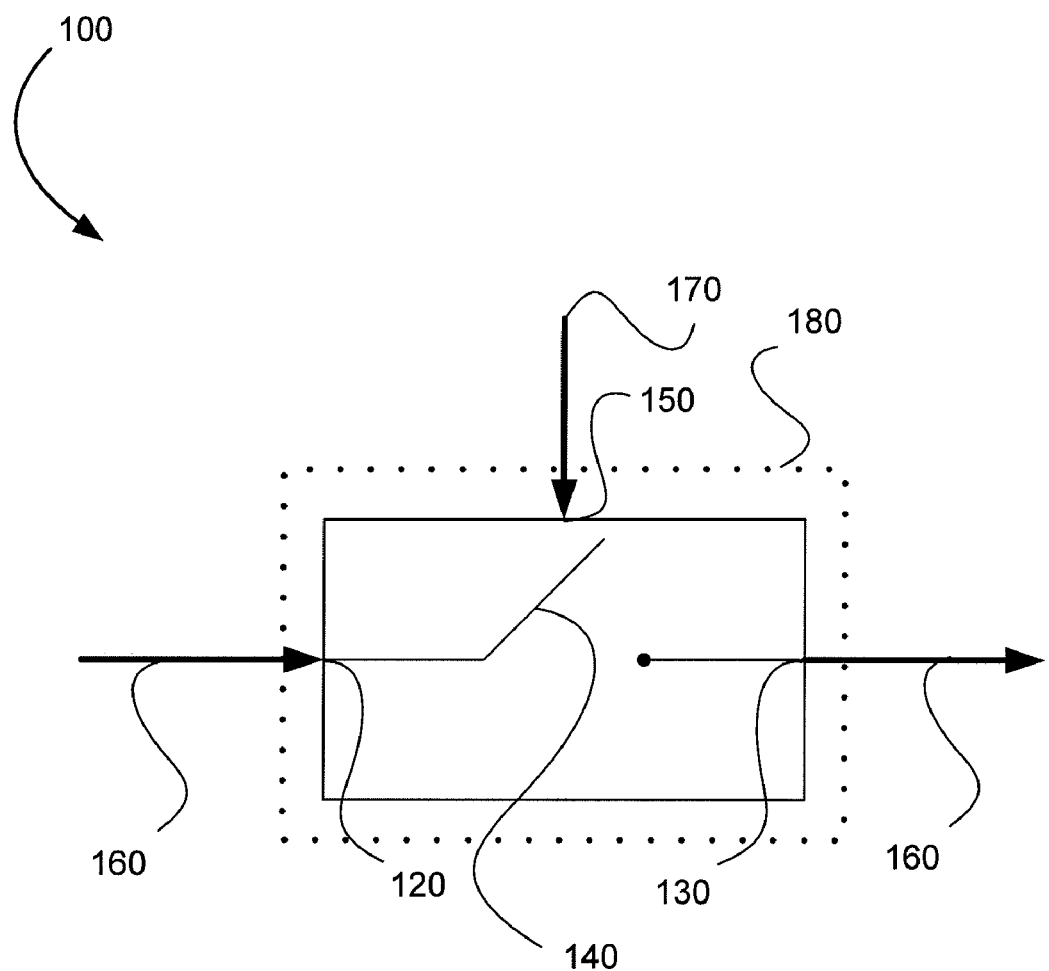
FIG. 1 is a simplified block diagram of an embodiment of a distributor subcircuit.

Devices, systems, and methods are described for the implementation of a novel architecture for programmably routing signals by using separate power domains for different components of the routing architecture. Input signals, such as reference clock signals, may be programmably routed to different signal dividers and phase-locked loops, determined by control signals sent to the circuit. Various components of the circuit may be maintained in isolated power domains to prevent coupling of noise between signal paths.

This description provides example embodiments only, and is not intended to limit the scope, applicability, or configuration of the invention. Rather, the ensuing description of the embodiments will provide those skilled in the art with an enabling description for implementing embodiments of the invention. Various changes may be made in the function and arrangement of elements without departing from the spirit and scope of the invention.

Thus, various embodiments may omit, substitute, or add, various procedures or components as appropriate. For instance, it should be appreciated that in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner.

It should also be appreciated that the following systems, methods, and software may individually or collectively be components of a larger system, wherein other procedures may take precedence over or otherwise modify their application. Also, a number of steps may be required before, after, or concurrently with the following embodiments.

In some circuits, it is desirable to be able to change which pins are inputs, which are outputs, and to change a signal's path within a circuit. For example, an integrated circuit with bidirectional pins may have any of these pins be programmed to receive an input reference clock signal. These signals can then be routed to the appropriate circuitry within the circuit, using multiplexer circuitry. A similar situation may be present for the output: a signal desired to be output may be programmably routed to a particular pin of an integrated circuit for output to another circuit or device.

Such programmable routing may involve the use of switches or switching devices. When multiple switches are part of the same power domain, meaning the switches are connected to the same voltage supply or power supply, noise may propagate between the signals through the switches and the power domain. This problem of noise propagation between signal paths may be especially poignant with clock signals. Isolating the routing of signals, switches, and other circuit components in different power domains may help to reduce the amount of noise propagated between signals.

A distributed multiplexer circuit may be used to programmably route signals, while decreasing the amount of noise transmitted between signal paths by isolating different signal paths and portions of signal paths in different power domains. A distributed multiplexer circuit architecture may be applied to clock signals in order to route reference clock signals to different processing circuitry while decreasing noise coupled between the clock signals. For example, a distributed multiplexer circuit may have two reference clock inputs. Programmable multiplexer circuitry may be used to route each clock signal to different phase-locked loop circuitry. The output of the phase-locked loop circuitry may then be routed to another multiplexer circuit, used to route the processed clock signal to other circuitry. For example, the circuit may be routed to another phase-locked loop circuit, or it may be routed to an output pin of an integrated chip, or both.

In some embodiments of a distributed multiplexer circuit, a distributor subcircuit may be used to route input signals. FIG. 1 illustrates a simplified block diagram of an embodiment of a distributor subcircuit 100 with input and output signals present. The distributor subcircuit 100 may include an input port 120, an output port 130, a switching device 140, and a control port 150. The distributor subcircuit 100 has one input port 120 and one output port 130. The input port 120 is configured to receive an input signal 160 from some other source. The input signal 160 may be an analog or digital signal. The input signal 160 is generated by an input source (not pictured). The input source may be located within the same circuit as the distributor subcircuit, or it may come from some other circuit. The input source may originate external to the integrated circuit chip the distributor subcircuit is on. In some embodiments, the input source may be a clock oscillator or some other source that creates a regular oscillating signal.

In the embodiment of FIG. 1, the input port 120 is connected to a switching device 140. FIG. 1 depicts one switching device, however, there may be more switching devices within a distributor subcircuit 110. The switching device may be a mechanical switch, an electrical switching device, such as a MOSFET, or any other device capable of being set to an "open" and "closed" state. In this embodiment, being "closed" refers to the input port 120 being connected to the output port 130. "Open" refers to the input port 120 not being connected to the output port 130. The switching device 140 is placed in either an open or closed state by information received at the control port 150. This control port 150 receives the information in the form of a control signal 170. The control signal 170 may be either a digital or analog signal. The control signal 170 may originate in the same circuit as the distributor subcircuit. In some embodiments, the control signal 170 originates external to the integrated circuit the distributor subcircuit 110 is on.

The illustrated embodiment of the distributor subcircuit 100 has one output port 130. Other embodiments of the distributor subcircuit may have two, three, or any number of output ports. Each switching device 140 may be coupled to one output port, with each switching device 140 being individually controlled by the control signal 170. In this way, each switching device 140 may be on or off regardless of the state of any other switching device. Output signal 160 may be routed to another circuit or subcircuit on the same or different integrated circuit.

Output port 130 may be tied to either ground or a logically high voltage so that if switching device 140 is open, a static signal will be present on output port 130. However, if switching device 140 is closed, the source or sink the output 130 is tied to will not greatly affect the output signal 160.

The distributor subcircuit 180 is part of a power domain. Alternatively, a power domain 180 is referred to as a voltage domain. This power domain 180 is generated by a voltage supply (not pictured), located either on or off the integrated circuit chip the distributor subcircuit 180 is located. The voltage supply may be connected to the distributor subcircuit 180 via a voltage supply pin on the integrated circuit chip. The voltage supply may allow the switching devices to be set to an open or closed state based upon the information received at the control port 150 from the control signal 170.

Figure 2:
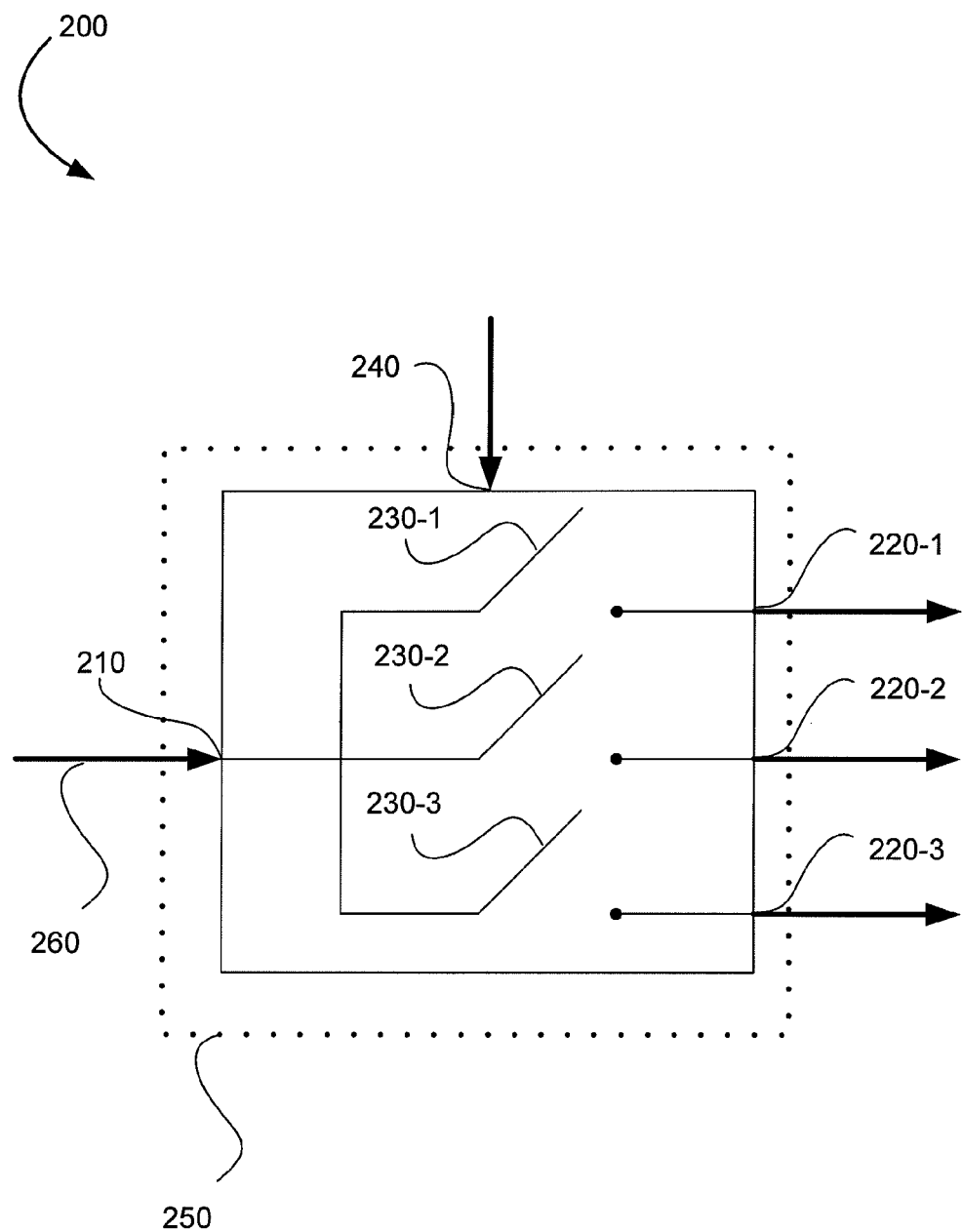
FIG. 2 is a simplified block diagram of an alternative embodiment of a distributor subcircuit.

As mentioned, a distributor subcircuit 100 may include more than one output port. FIG. 2 illustrates an embodiment of a distributor subcircuit 200 with three output ports 220. Distributor subcircuit 200 contains an input port 210, three output ports 220, three switching devices 230, and a control port 240. Distributor subcircuit 200 may function similarly to distributor subcircuit 100. Switching devices 230 may be the same switching devices described in relation to distributor subcircuit 100. Switching devices 230 may be controlled independently by the control signal received at the control port 240. For example, switching device 230-1 may be closed, while both switching devices 230-2 and 230-3 are open. Any permutation of the possible states of the switching devices 230 may be possible. Control port 240 may receive any number of control signals. In some embodiments, one control signal of serial digital data may be received. In some embodiments, parallel data may be received on multiple signal paths. In some embodiments, an individual logical high or logical low signal controls each switching device 230.

Similar to distributor subcircuit 100, distributor module 100 is part of a power domain 250. In the embodiment of FIG. 2, the switching devices 230 are all part of the same power domain 250. Notably, noise coupling between the signals on output ports 220 is not an issue because each output path may either be outputting the same input signal 260 or a static signal. The distributor subcircuits of FIGS. 1 and 2 may be scaled to accommodate any number of desired outputs.

Figure 3:
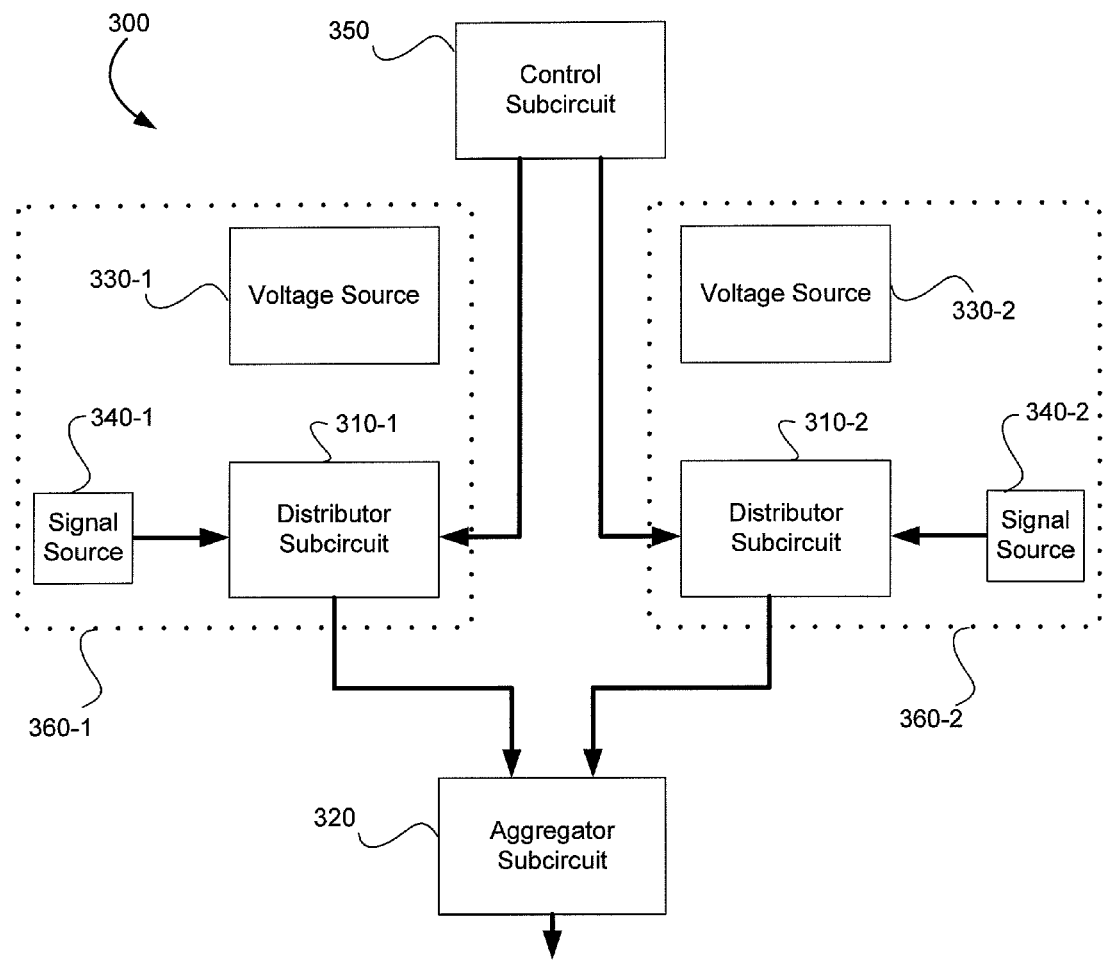
FIG. 3 is a simplified block diagram of an embodiment of a distributed multiplexer circuit having two distributor subcircuits in separate power domains connected to an aggregator subcircuit.

Embodiments of distributor subcircuits similar to distributor subcircuits 100 and 200 may be incorporated into a larger circuit to route signals. FIG. 3 illustrates a simplified block diagram of an embodiment of a distributed multiplexer 300 that includes multiple distributor subcircuits. The distributed multiplexer circuit 300 contains two distributor subcircuits 310, an aggregator subcircuit 320, two voltage sources 330, two signal sources 340, and a control subcircuit 350.

In this embodiment, a control subcircuit 350 is present. The control subcircuit 350 may create the control signal of FIG. 1 and FIG. 2, or a different control signal or signals. The control subcircuit 350 of FIG. 3 controls the states of switching devices in two distributor subcircuits 310. In other embodiments, the control subcircuit may control any number of distributor subcircuits.

The distributor subcircuits 310 are powered by different voltage sources 330. The regions defined by 360 illustrate the components of the circuit powered by the voltage sources 330. In the illustrated embodiment, the signal source 340-1 which provides an input signal to distributor subcircuit 310-1, is in the same power domain 360-1 as the distributor subcircuit 310-1. In other embodiments, the signal source 340-1 may not be in the same power domain as the distributor subcircuit 310-1.

Signal source 340-2 may be part of a different power domain 360-2 than signal source 340-1. As illustrated, signal source 340-2 may be in the same power domain as distributor subcircuit 310-2. In other embodiments, the signal source 340-2 may be in a different power domain than the distributor subcircuit 310-2. The signal sources may be clock oscillators, another clock source, or another circuit capable of generating an input signal, on or off of the integrated circuit where the distributed multiplexer circuit 300 is located.

Voltage sources 330 may be connected via different input pins on the integrated chip the distributed multiplexer circuit 300 is residing on. In some embodiments, voltage sources 330 may be created by the same power supply, but have each voltage isolated from each other, such that noise between the power domains is decreased.

In the embodiment of FIG. 3, the aggregator subcircuit 320 is connected to both distributor subcircuits 310. Based on the output from the control subcircuit 350, only one output from the distributor subcircuits 310 may be active. In other embodiments, multiple outputs from the distributor subcircuits 310 may be active, and the aggregator subcircuit may choose a desired signal via a selector device. The aggregator subcircuit 320 may be a logical AND gate. If the aggregator subcircuit is an AND gate, inputs to the aggregator subcircuit that are not in use may be held logically high; the signal from the distributor subcircuits 310 that is desired to be transmitted through the aggregator 320 would transition from logical high to logical low. Because of the logic of an AND gate, if all other signals are held high, the output will be the same as the transitioning signal.

The aggregator subcircuit 320 is illustrated as having two input ports, however any number of input ports is possible. In other embodiments, the aggregator subcircuit may include a switch or other selection device to select from among the inputted signals. The output signal of the aggregator subcircuit 320 is routed to other circuitry, either on the same or different integrated circuit chip. The aggregator subcircuit 320 may be in the power domain of 330-1, 330-2, or a third power domain.

Figure 4:
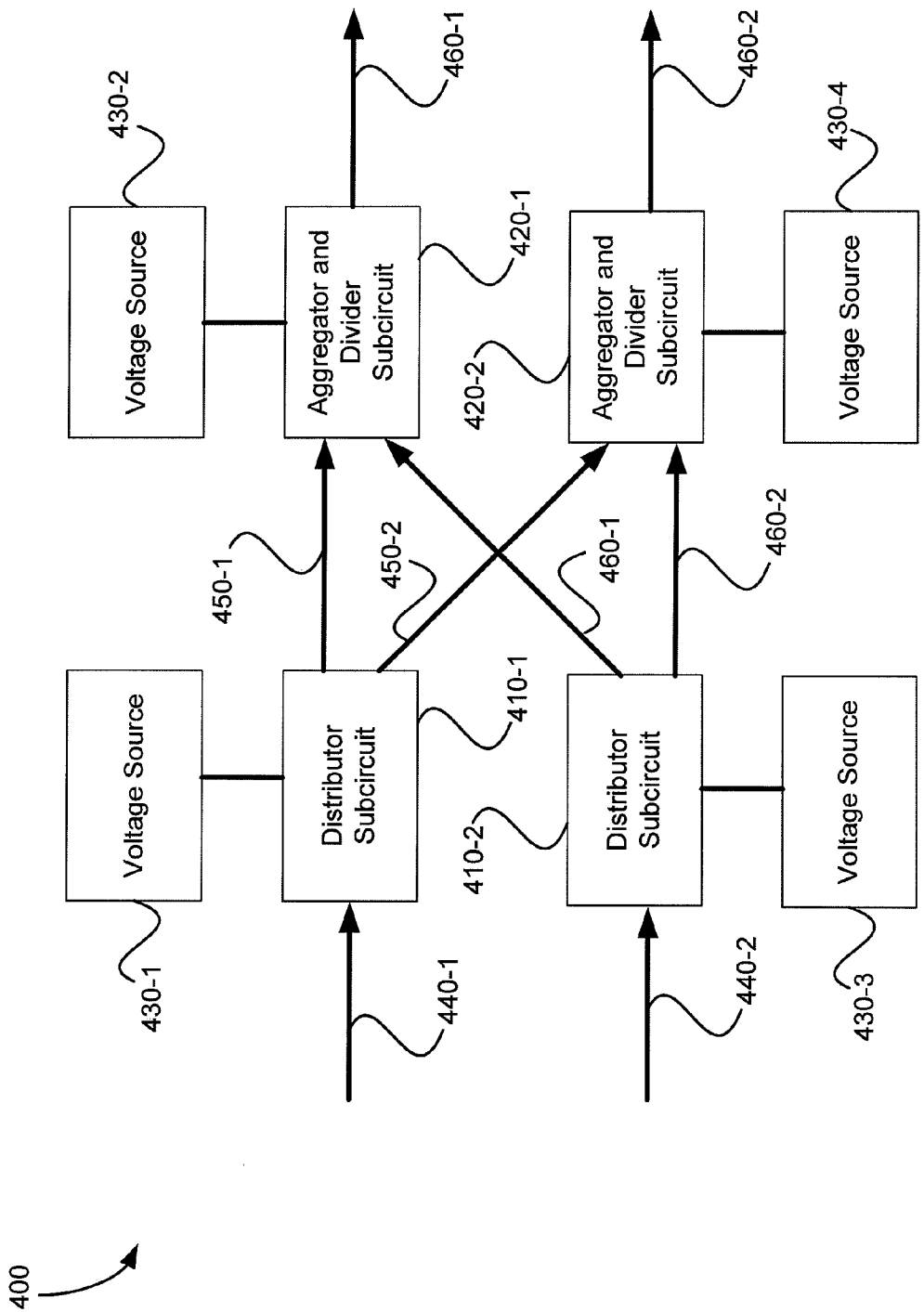
FIG. 4 is a simplified block diagram of an embodiment of a distributed multiplexer circuit having two distributor subcircuits connected to two aggregator and divider subcircuits.

Embodiments of a distributed multiplexer circuit with multiple distributor subcircuits and multiple aggregator circuits may be implemented. FIG. 4 illustrates a simplified block diagram of an embodiment of a distributed multiplexer circuit 400 with two distributor subcircuits 410 and two aggregator subcircuits 420. The distributed multiplexer circuit 300 of FIG. 3 may be part of a larger distributed multiplexer circuit 400 as in FIG. 4, or the distributed multiplexer circuit 400 may be a different distributed multiplexer circuit. The distributed multiplexer circuit 400 has distributor subcircuits 410, aggregator subcircuits integrated with divider subcircuits 420, and voltage sources 430.

The distributor subcircuits 410 may be the same distributor subcircuit as in FIGS. 1-3. In this embodiment, distributor subcircuits 410 each have an input signal 440-1 and 440-2. These input signals 400 may be created by signal sources such as signal sources 340 in FIG. 3, or may be different signal sources. The distributor subcircuit 410-1 of FIG. 4 is connected to the aggregator and divider subcircuit 420-1, and to the aggregator and divider subcircuit 420-2. Therefore, in this embodiment, an input signal 440-1 may be routed to either aggregator and divider subcircuit, to neither aggregator and divider subcircuit, or to both aggregator and divider subcircuits 420. A similar situation is present for distributor subcircuit 410-2: it may route input signal 440-2 to either of aggregator and divider subcircuits 420, to both, or to neither. Similar to the embodiment of FIG. 3, the routing is dependent on the control signals, not pictured in this embodiment.

In some embodiments, a divider subcircuit is integrated with the aggregator subcircuit. The aggregator subcircuit may still include an AND gate to output only one active signal, or may use a switch or other selector device to choose from among the incoming input signals 450-1 and 450-2 as described in relation to the aggregator subcircuit of FIG. 3. The divider subcircuit may be used to decrease the frequency or clock speed of an input signal. The amount of decrease in clock speed may be preset or programmable. In some embodiments, a 10-bit programmable divider is used. The functionality of these dividers is well known to those with skill in the art. The aggregator subcircuits and divider subcircuits 420 may be considered one or separate subcircuits, and are drawn as one component for ease of understanding and simplicity.

The distributed multiplexer circuit 400 has considerable flexibility in how the input signals 440 are routed and processed. For example, in some embodiments, an input clock signal 440-1 may be routed by distributor module 410-1 to both aggregator and divider subcircuits 420 based upon a control signal or signals received at distributor subcircuit 410-1. Accordingly, an input clock signal 440-2 may not be routed to either aggregator and divider subcircuit by distributor subcircuit 410-2 based upon a control or signals received at distributor subcircuit 410-2. Each output signal from distributor subcircuit 410-2 may be held logically high. Aggregator and divider subcircuit 420-1 may then divide signal 450-1 from the distributor subcircuit 410-1 by a preset value. This divided clock signal 460-1 is then output to other circuitry or off of the integrated circuit chip. Aggregator and divider subcircuit 420-2 may divide signal 450-2 from the distributor subcircuit 410-1 by a different preset or programmable value. This divided clock signal 460-2, created from the same reference input clock signal 440-1 is then output to other circuitry on or off of the integrated circuit chip.

The embodiment of the distributed multiplexer circuit of FIG. 4 has four voltage sources. In this embodiment, the voltage sources are shown as connected to their respective components via a line, rather than within the same dotted outline as in previous drawings, however the meaning is the same: the voltage source is providing the power for the associated subcircuit. In this embodiment, four voltage sources 430 are present. Therefore, distributor subcircuit 410-1 and distributor subcircuit 410-2 will be in different power domains. Likewise, aggregator and divider subcircuit 420-1 is associated with voltage source 430-2, and aggregator and divider subcircuit 420-2 is associated with voltage source 430-4. In some embodiments, voltage source 430-3 and 430-4 will be the same voltage source. Any combination of voltage domains is possible. For example, voltage sources 430-3 and 430-4 may be the same voltage source, each voltage source may be supplied by a different voltage supply, or one voltage source may be used for 430-1, 430-2, 430-3, and 430-4. As in FIG. 3, each voltage source may be supplied to the distributed multiplexer circuit 400 by a separate input pin on the integrated circuit. In some embodiments, one voltage supply may be used to generate each voltage supply, with some form of isolation occurring between each power domain.

Figure 5:
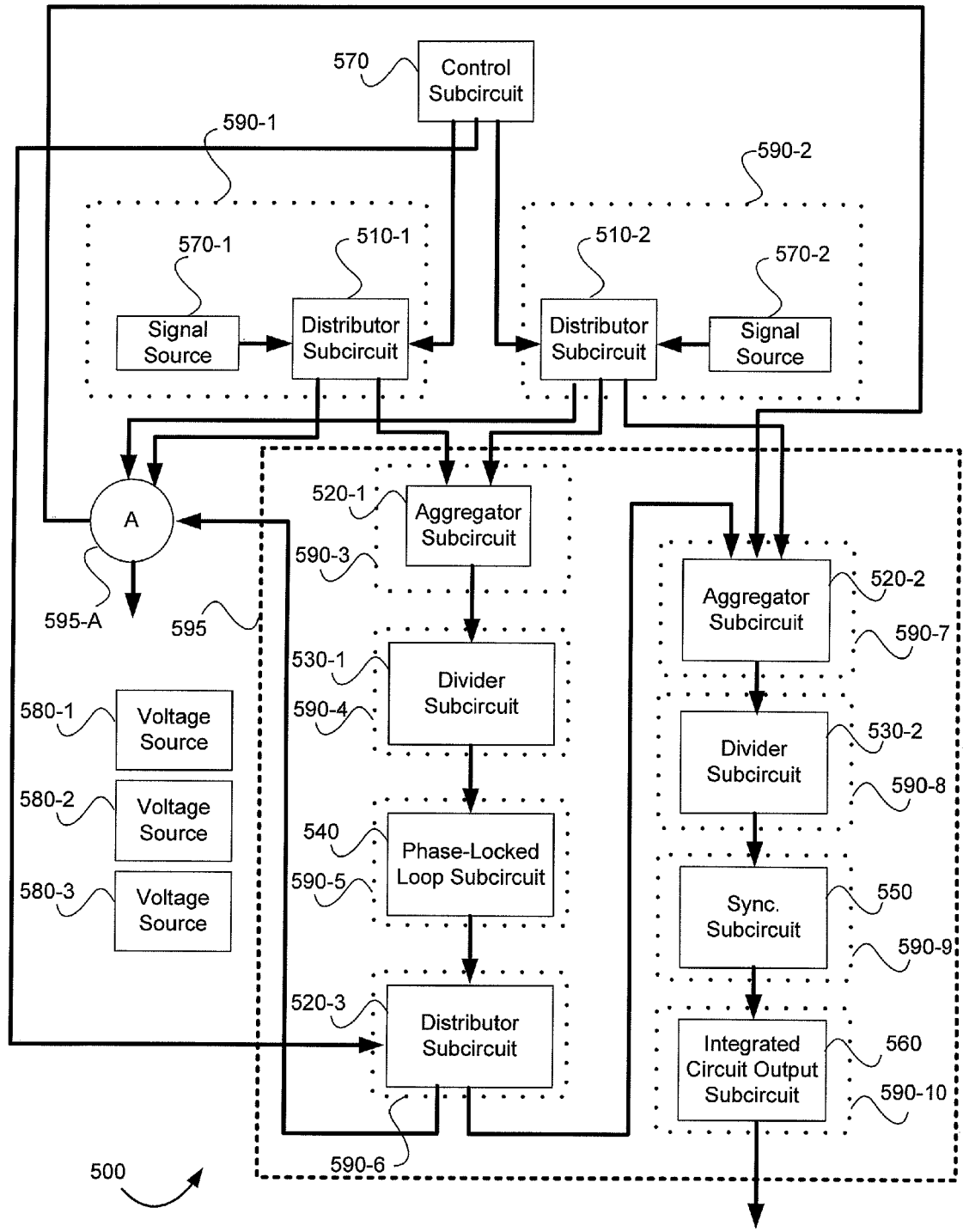
FIG. 5 is a simplified block diagram of an embodiment of a distributed multiplexer circuit with a phase-locked loop subcircuit.

The distributed multiplexer circuit 400 may be incorporated into a more complex distributed multiplexer circuit that may manipulate and route clock signals. FIG. 5 illustrates a simplified block diagram of a distributed multiplexer circuit 500 with additional functionality. The circuits of FIGS. 1-4 may be incorporated as part of distributed multiplexer circuit 500, or the distributed multiplexer circuit 500 may be a separate distributed multiplexer circuit. Distributed multiplexer circuit 500 contains distributor subcircuits 510, aggregator subcircuits 520, divider subcircuits 530, phase-locked loop subcircuit 540, synchronization subcircuit 550, and integrated circuit output subcircuit 560.

In the embodiment of FIG. 5, distributor subcircuits 510 are controlled by control subcircuit 570. The distributor subcircuits 510 may be the distributor subcircuits described in FIGS. 1 and 2, or may be different distributor subcircuits. Control subcircuit 570 may function as described in relation to FIG. 3, or may be a different control subcircuit. In distributed multiplexer circuit 500, a third distributor subcircuit 520-3 is present. This distributor subcircuit distributes the output of the phase-locked loop subcircuit 540. This distributor subcircuit may be the distributor subcircuit of FIG. 1 or 2, or may be a different distributor subcircuit.

The aggregator subcircuit 520-1 is depicted as separate from divider subcircuit 530-1. However, these subcircuits may function as the combined subcircuit does in FIG. 4. The aggregator subcircuit 520-1 may be the aggregator in FIGS. 3 and 4, or may be a different aggregator circuit. The aggregator subcircuit 520-1 may be a logic gate, such as an AND gate, or a combination of logic gates. The divider subcircuit 530-1 may be the divider subcircuit of FIG. 4, or may be a different divider subcircuit. The divider subcircuit 530-1 may decrease the frequency or clock rate of the input signal by a predefined or programmable amount.

A phase-locked loop subcircuit 540 may be connected to the divider subcircuit 530-1. The phase-locked loop subcircuit 540 may be used to increase the frequency or clock rate of the input signal. The phase-locked loop subcircuit 540 may increase the frequency or clock rate of the input signal by a fixed amount or a programmable amount. The phase-locked loop subcircuit 540 may include logic gates. Additionally, a divider subcircuit (not pictured) may be incorporated into the phase-locked loop subcircuit 540. The output of the phase-locked loop subcircuit 540 may be input to a distributor module 520-3, as previously described. This distributor subcircuit 520-3 may route the output signal to any number of destination circuits or outputs. As illustrated in the embodiment of FIG. 5, the distributor subcircuit has two output ports. Embodiments of distributor subcircuit 520-3, may have any number of output ports. The input to the distributor subcircuit 520-3 may be routed to any combination of output ports based upon input received from the control subcircuit 570. The control subcircuit 570 may be more than one circuit to control the distributor subcircuits 510-1, 510-2, and 510-3, or may be one control subcircuit 570.

In some embodiments of distributed multiplexer circuit 500, the distributor subcircuit 520-3 connects to an aggregator subcircuit 520-2. This aggregator subcircuit 520-2 is depicted as having three input ports, however it may have any number of input ports. Distributor subcircuit 510-2 may connect to aggregator subcircuit 520-2, this allows a signal from signal source 570-1 to bypass the aggregator subcircuit 520-1, divider subcircuit 530-1, phase-locked loop subcircuit 540, and distributor subcircuit 520-3. This may be desirable if a reference clock signal is being output by signal source 570-1, and it is not desired to be processed by the intervening circuitry.

The aggregator subcircuit 520-1 may be connected to another divider subcircuit 530-2. This divider subcircuit may function the same as divider subcircuit 530-1, or the divider subcircuit described in relation to FIG. 4, or may be a different divider subcircuit.

The synchronization subcircuit 550 may be a buffer, flip-flop, logic gate, or other piece of circuitry. The purpose of the synchronization subcircuit 550 is to change the power domain that the input signal is in. For example, if it is desired that the output of the synchronization subcircuit 550 to the integrated circuit output be in the same power domain as the signal source 570-1, the synchronization subcircuit 550 and the signal source 570-1 could be powered by the same voltage source.

The synchronization subcircuit 550 may be connected to an integrated circuit output subcircuit 560. Alternatively, the output of the synchronization subcircuit 550 may be connected to other circuitry on the same integrated circuit chip. The integrated circuit output subcircuit 560 may be a connection to a pin or pins on the integrated circuit chip. The integrated circuit output subcircuit 560 may include a buffer, logic gates or other additional circuitry to act as an interface between the input to the integrated circuit output subcircuit 560 and the target of the output signal.

Several voltage sources 580 are present. Each component is outlined in a power domain 590. While three voltage sources are illustrated, there may be one or more voltage sources. An individual voltage source, defining an individual power domain, for each subcircuit may be present. For example, each subcircuit pictured may have its own power domain and accompanying voltage source. In some embodiments, particular components are in the same power domain. For example, each divider subcircuit 530 may be in the same power domain. FIG. 5 depicts signal source 570-1 in the same power domain as distributor 510-1, and signal source 570-2 as in the same power domain as distributor 510-2. In some other embodiments, one or both signal sources 520 may be in power domains different from the distributor subcircuits 510.

Connected with distributor subcircuits 510 is Abstraction-A 595-A. Abstraction-A 595-A is a replica of subcircuit 595. Abstraction A may contain every subcircuit contained in subcircuit 595. The divider subcircuits and phase-locked loop subcircuit of Abstraction-A 595-A may have different programmed or preset divider values for its divider subcircuits and multiplier values for its phase-locked loop subcircuit. Therefore, if the same signal is input to both subcircuits 595 and 595-A, the output of each subcircuit may have a different frequency or clock rate based upon these preset or programmed values. There is no limit to the number of subcircuits 595 that embodiments of distributed multiplexer circuit may have. For example, a third and fourth subcircuit similar to 595 and 595-A may be added and connected to distributor subcircuits 510-1 and 510-2. Likewise, the number of output ports of distributor subcircuits 510-1 and 510-2 may be increased to accommodate the ability to route to a greater number of subcircuits similar to 595 and 595-A. Distributor subcircuit 520-3 may route an output to subcircuit 595-A. This allows an input signal to be processed through multiple phase-locked loop subcircuits and other circuitry. Abstraction-A 595-A may use the same voltage sources or different voltage sources from subcircuit 595.

Figure 6:
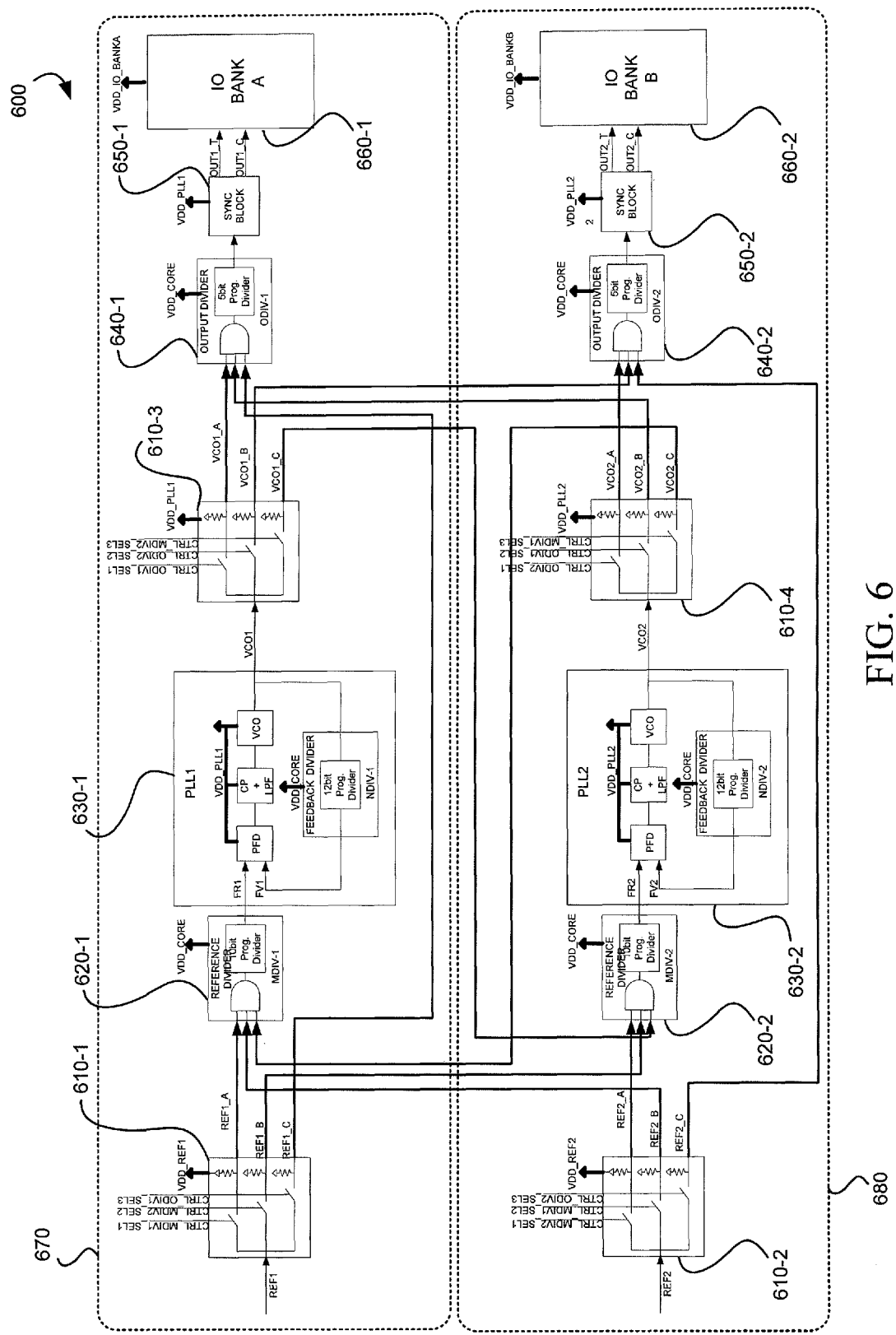
FIG. 6 is an embodiment of a distributed multiplexer circuit to programmably route clock signals.

Each block subcircuit of FIGS. 1-5 may be implemented using digital logic and analog circuitry. FIG. 6 illustrates one embodiment of a possible distributed multiplexer circuit implemented using such circuitry. The distributed multiplexer circuit 600 of FIG. 6 may be the distributed multiplexer circuit of FIGS. 3-5, or may be a different distributed multiplexer circuit. Distributor subcircuit 610-1 may be an embodiment of the distributor subcircuit described in relation to FIGS. 1-5 or may be a different distributor subcircuit. In this embodiment, a single reference signal is input (REF1) to the distributor subcircuit, and is connected to three switching devices. REF1 may be a reference clock signal. Each switch in distributor subcircuit 610 is controlled by a control signal, in this embodiment, the control signals are labeled CTRL_MDIV1_SEL1, CTRL_MDIV2_SEL2, and CTRL_ODIV1_SEL3. In this embodiment, the distributor subcircuit 610-1 is part of the VDD_REF1 power domain.

Each output signal is tied logically high through a resistor. Therefore, if the switch associated with that output port is open, the output may be a constant logical high value. If the switch is closed, the output of that output port will be the input REF1 signal. In this embodiment, zero, one, two, or three outputs may be connected to the REF1 input signal.

In this embodiment, the outputs of the distributor subcircuit 610-1 are connected to the reference dividers 620-1, 620-2, and output divider 640-1. In this embodiment, the reference dividers 620 are combinations of aggregator subcircuits and divider subcircuits. The reference divider subcircuits 620 may be the same as the aggregator and divider subcircuits of FIGS. 3-5, or may be different reference divider subcircuits. In this embodiment, an AND gate is the aggregator subcircuit, having three inputs: one from distributor subcircuit 610-1, one from distributor subcircuit 610-2, and one from distributor subcircuit 610-3. The signal outputted from the AND gate is then divided by a 10-bit programmable divider. The input signal may be divided by a value to reduce the frequency or clock rate of the signal. In this embodiment, the reference divider 620-1 is part of the VDD_CORE power domain. The output of the reference divider is input to a phase-locked loop subcircuit 630-1, labeled PLL1.

The phase-locked loop subcircuit 630-1 may be the phase-locked loop subcircuit of FIG. 5, or may be a different phase-locked loop subcircuit. The content of the phase-locked loop subcircuit 630-1 is well known to those with skill in the art, and will not be discussed here. The phase-locked loop subcircuit 630-1 serves to increase the clock rate or frequency of the input signal. Phase-locked loop subcircuit 630-1 is part of a VDD-PLL1 power domain. The output of the phase-locked loop subcircuit 630-1 is input to a distributor subcircuit 610-3.

The distributor subcircuit 610-3 may function similarly to distributor subcircuit 610-1. In this embodiment distributor subcircuit 610-3 also has three control signals controlling the switching devices with distributor subcircuit 610-3. In this embodiment, distributor subcircuit 610-3 is part of the VDD_PLL1 power domain. The outputs of distributor subcircuit 610-3 are routed to output divider 640-1, output divider 640-2, and reference divider 620-2.

Output divider 640-1 may function similarly to a reference divider, such as 620-1 or 620-2. The output divider 640-1 contains an aggregator circuit, here an AND gate, and a 5-bit programmable divider. The output divider 640-1 is part of the VDD_CORE power domain. The output divider 640-2 may function similarly to the output divider 640-1. In this embodiment, both output dividers are the same, and are part of the same power domain.

The output of output divider 640-1 is connected to a synchronization block 650-1. In this embodiment, the synchronization block may be a buffer or flip-flop. The synchronization block 650-1 is part of the VDD-PLL1 power domain. This brings the output signal back into the power domain of the phase-locked loop 630-1. Finally, the synchronization block 650-1 outputs the signal to IO Bank A.

IO Bank A 660-1 may be the integrated circuit output subcircuit of FIG. 5, or it may be some other circuit. The IO Bank A 660-1 may serve as an interface between the distributed multiplexer circuit 600 and the input and output pins of the integrated circuit chip the distributed multiplexer circuit 600 resides on.

As is evident from FIG. 6, subcircuit 680 is a replica of subcircuit 670. In this embodiment, the subcircuits share certain power domains, such as VDD_CORE. Further, the subcircuits may route signals between each other depending on the control signals. Subcircuit 680 may use some or all of the control signals used in subcircuit 670. Subcircuit 680 has a second reference clock input signal. This clock input signal, REF2, may be from the same or different clock source or oscillator.

There is no limit to the number of subcircuits, similar to 670 and 680, that may exist in a distributed multiplexer circuit. As the number of subcircuits is increased, the number of power domains may be increased, as well as the number of interconnects between the subcircuits allowing for increased flexibility to route signals.

Figure 7:
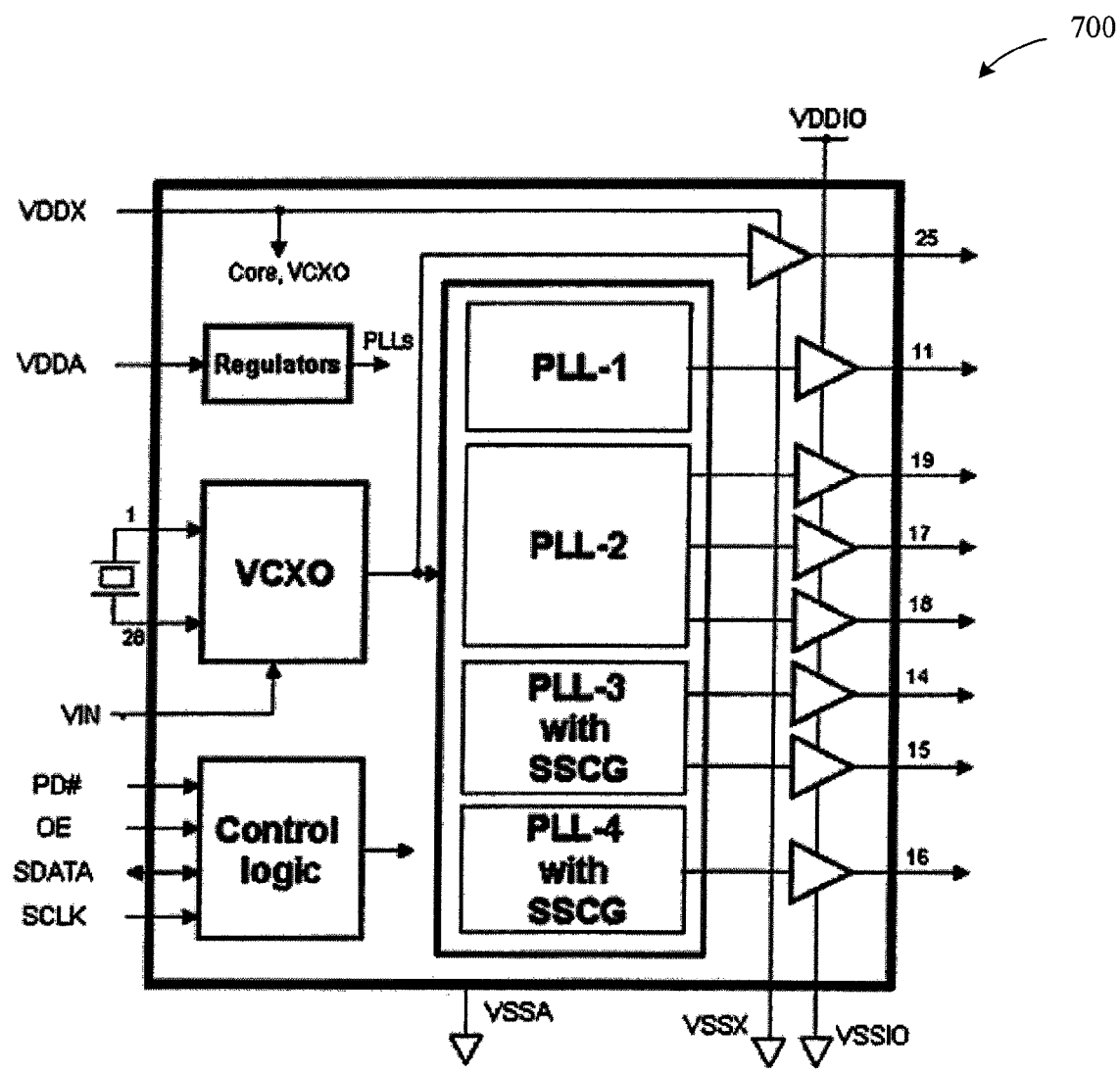
FIG. 7 is a simplified block diagram of an embodiment of a clock generator circuit incorporating a distributed multiplexer circuit to programmably route signals.

A distributed multiplexer circuit may be incorporated into other circuits, such as a clock generator. FIG. 7 is a simplified block diagram of an embodiment of a clock generator 700 with four phase-locked loop subcircuits interconnected. Four phase-locked loops (PLL-1, PLL-2, PLL-3, and PLL-4) are interconnected in a fashion similar to that described above in reference to FIG. 6. A plurality of clock outputs, labeled 11, 19, 17, 18, 14, 15, 16 are generated from the four phase-locked loops and are powered through an intervening set of clock output buffers. In this embodiment, the clock output buffers are powered through an interface power terminal, VDDIO, and an interface ground terminal VSSIO. A set of power regulators provides a regulated source of power to each of the respective powered domains provided to the four phase-locked loops. The power regulators are supplied with power through an array power terminal VDDA and an array ground terminal VSSA. A control logic block Control_logic is supplied with clock and control signals to determine the control signals provided to the four phase-locked loops PLL-1,2,3,4. Signals are input to the control logic block Control_logic through a serial clock terminal SCLK, serial data terminal SDATA, output enable terminal OE, and power down terminal PD#.

In the embodiment of FIG. 7, A voltage controlled crystal oscillator VCXO is controlled with an input control voltage VIN and is coupled to an external crystal through crystal connection pins 1, 28. A crystal power supply terminal VDDX and a crystal ground terminal VSSX provide coupling to power for the voltage controlled crystal oscillator VCXO and the core of the clock generating system 700. An output of the voltage controlled crystal oscillator VCXO is provided through a VCXO output buffer to a VCXO buffered clock output 25. The VCXO output buffer is powered through the crystal power supply terminal VDDX and the crystal ground terminal VSSX.

Programming data for establishing the control signals to the four phase-locked loops PLL-1,2,3,4 is contained in data passed from an external environment to the control logic block Control_logic through the serial data terminal SDATA. The control logic block Control_logic assembles the programming data and produces control signals similar to those in Table 1 for the two phase-locked loop example. The control signals produced by the control logic block Control_logic are provided to programmable routing circuits in a portion of the four phase-locked loops PLL-1,2,3,4. In a fashion similar to that shown above for the two phase-locked loop example, the control signals selectively establish coupling between a clock reference signal and outputs of internal phase-locked loop blocks (not shown). The clock reference signal is provided on an output of the voltage controlled crystal oscillator VCXO.

A user may determine a number of clock signals and their frequencies that are desired to be generated. The clock signals determined are generated by choosing control signal values to be applied to selection busses, referred to as xDIVn_CLK_SEL<1:0> in FIG. 6. The user may further set appropriate values for configuring the programmable dividers. Table 1 shows one possible embodiment of control signals that may be used to control the routing of signals, such as in the distributed multiplexer circuit 600 in FIG. 6. Note that a three bit or more set of controller signals may be used (instead of two as shown in Table 1) where more phase locked loops and inputs are present. From the control values and divider values specified, the user selects the clock reference source, the path of the reference source signal, including both signal processing circuits and their respective power domains, and determines a final frequency of the processed clock signal delivered to a selected output.

TABLE 1

Control signals mapping of the present invention

| MDIV1_CLK_SEL<1:0> | Reference Divider-1 Clock Source | |
|---|---|---|
| "00" | GND | |
| "01" | REF1 | CTRL_MDIV1_SEL1 = "1" |
| "10" | REF2 | CTRL_MDIV1_SEL2 = "1" |
| "11" | VCO2 | CTRL_MDIV1_SEL3 = "1" |
| MDIV2_CLK_SEL<1:0> | Reference Divider-2 Clock Source | |
| "00" | GND | |
| "01" | REF2 | CTRL_MDIV2_SEL1 = "1" |
| "10" | REF1 | CTRL_MDIV2_SEL2 = "1" |
| "11" | VCO1 | CTRL_MDIV2_SEL3 = "1" |
| ODIV1_CLK_SEL<1:0> | Output Divider-1 Clock Source | |
| "00" | GND | |
| "01" | VCO1 | CTRL_ODIV1_SEL1 = "1" |
| "10" | VCO2 | CTRL_ODIV1_SEL2 = "1" |
| "11" | REF1 | CTRL_ODIV1_SEL3 = "1" |
| ODIV2_CLK_SEL<1:0> | Output Divider-2 Clock Source | |
| "00" | GND | |
| "01" | VCO2 | CTRL_ODIV2_SEL1 = "1" |
| "10" | VCO1 | CTRL_ODIV2_SEL2 = "1" |
| "11" | REF2 | CTRL_ODIV2_SEL3 = "1" |

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. A distributed signal multiplexer circuit to programmably route electronic signals, comprising:
a first distributor subcircuit, including an input port, an output port, a switch, and a control port, configured to connect the input port to the output port through the switch, a state of the switch being controlled by information received at the control port, the first distributor subcircuit being part of a first power domain defined by a first voltage source;
a second distributor subcircuit, including an input port, an output port, a switch, and a control port, configured to connect the input port to the output port through the switch, a state of the switch being controlled by information received at the control port, the second distributor subcircuit being part of a second power domain defined by a second voltage source different from the first voltage source; and
an aggregator subcircuit, including a first input port, a second input port, an output port providing an output port signal, and a selector device, configured to have the first input port communicatively coupled with the output port of the first distributor subcircuit, the second input port coupled with the output port of the second distributor subcircuit, and the output port signal being a signal selected from among the signals received at the input port of the first distributor subcircuit and the input port of the second distributor subcircuit.

2. The distributed signal multiplexer circuit of claim 1, having a first source configured to generate a first signal input to the input port of the first distributor subcircuit, the first source being part of the first power domain, and a second source configured to generate a second signal input to the input port of the second distributor subcircuit, the second source being part of the second power domain.

3. The distributed signal multiplexer circuit of claim 1, having the aggregator subcircuit as part of a third power domain isolated from the first power domain and the second power domain.

4. The distributed signal multiplexer circuit of claim 1, configured to have a clock signal as input to the input port of the first distributor subcircuit.

5. The distributed signal multiplexer circuit of claim 4, wherein a second clock signal, configured to come from a source distinct from the first clock signal, is configured to be input to the input port of the second distributor subcircuit and having a generator of the second clock signal as part of the second power domain.

6. The distributed signal multiplexer circuit of claim 1, further comprising a first signal divider subcircuit, including an input port and an output port, configured to reduce a clock rate of an input signal received at the input port, and output a reduced clock rate signal at the output port, and the input port of the first signal divider subcircuit being coupled with the output port of the aggregator subcircuit.

7. The distributed signal multiplexer circuit of claim 1, further comprising a phase-locked loop subcircuit, including an input port, an output port, and circuitry to multiply the frequency of an input signal, configured to have the output port of the aggregator subcircuit coupled with the input port of the phase-locked loop subcircuit.

8. The distributed signal multiplexer circuit of claim 7, wherein the first distributor subcircuit further comprises a second switch and a second output port, said first distributor subcircuit configured to have the input port connected to the second output port through the second switch, the state of the second switch being controlled by information received at the control port of the first distributor subcircuit, the second output port coupled with an input port of a second aggregator subcircuit.

9. The distributed signal multiplexer circuit of claim 8, configured to have the second output port of the first distributed subcircuit couple with an input port of the second aggregator subcircuit.

10. The distributed signal multiplexer circuit of claim 7, further comprising a second phase-locked loop, wherein the aggregator subcircuit further includes a third input port, the aggregator subcircuit being configured to have the third input port of the aggregator subcircuit coupled with the output port of the second phase-locked loop.

11. The distributed signal multiplexer circuit of claim 1, having the output port of the aggregator subcircuit coupled with an output port of an integrated circuit.

12. The distributed signal multiplexer circuit of claim 11, having the aggregator subcircuit share a common power domain with the output of the integrated circuit.

13. The distributed signal multiplexer circuit of claim 6, further comprising a phase-locked loop subcircuit, including an input port, an output port, and circuitry to multiply the clock rate of a signal received at the input port, and configured to couple the input port coupled with the output port of the first signal divider subcircuit.

14. The distributed signal multiplexer circuit of claim 13, wherein the phase-locked loop subcircuit is part of a fourth power domain isolated from the first power domain, the second power domain, and the third power domain.

15. The distributed signal multiplexer circuit of claim 1, wherein the aggregator subcircuit is a logic gate selected from a group consisting of:
    a NAND gate,
    an AND gate,
    a NOR gate, and
    an OR gate.

16. A clock multiplexer circuit for programmably routing clock signals, comprising:
    a first switching module, including a reference clock input port, a first reference clock output port, a second reference clock output port, a first switch, a second switch, and a switch control port, configured to have the reference clock input port connected to the first output port via the first switch, the reference clock input port connected to the second reference clock output port via the second switch, each switch being in either an open or closed state depending on a signal received at the control port, and the first switching module is part of a first power domain;
    a second switching module, including a reference clock input port, a first reference clock output port, a second reference clock output port, a first switch, a second switch, and a switch control port, configured to have the reference clock input port connected to the first output port via the first switch, the reference clock input port connected to the second reference clock output port via the second switch, each switch being in either an open or closed state depending on a signal received at the control port, and the first switching module is part of a second power domain; and
    a first aggregator module, including a first input port, a second input port, an output port, and circuitry to output a single signal from among the signals received at the input ports, configured to have the first input port coupled with the first output port of the first switching module, and the second input port coupled with the first output port of the second switching module; and
    a second aggregator module, including a first input port, a second input port, an output port, and circuitry to output a single signal from among the signals received at the input ports, configured to have the first input port coupled with the second output port of the first switching module, and the second input port coupled with the second output port of the second switching module.

17. The clock multiplexer circuit of claim 16, wherein the first aggregator module and the second aggregator module are part of a third power domain, independent from the first power domain and the second power domain.

18. The clock multiplexer circuit of claim 16, further comprising a reference divider module, including an input port, an output port, and circuitry to divide the frequency of a signal input at the input port; the reference divider module configured to output a lower frequency signal at the output port than the signal received at the input port, and the input port is coupled with the output port of the first aggregator module.

19. The clock multiplexer circuit of claim 18, further comprising a phase-locked loop module, including an input port, an output port, and circuitry to increase the frequency of a signal input at the input port, the phase-locked loop module configured to have the input port coupled with the reference divider output port.

20. The clock multiplexer circuit of claim 19, further comprising a third switching module, including an input port, a first output port, a second output port, a first switch, a second switch, and a control port, configured to have the input port connect to the first output port through the first switch, the input port connect to the second output port through the second switch, the state of each switch controlled by information received via the control port, and the input port coupled to the output port of the phase-locked loop module.

21. The clock multiplexer circuit of claim 20, wherein the second aggregator module further comprises a third input port, configured to have the second output port of the third switching module coupled with the third input port of the second aggregator module.

22. A programmable clock routing circuit on an integrated circuit chip, comprising:
    a first signal multiplexer, including a reference clock input port, at least three output ports, at least three switches, and a control logic input, the first signal multiplexer part of a first isolated power domain, the input port coupled with each output port via a switch, each switch being opened or closed according to signals received via the control port;

a second signal multiplexer, including a reference clock input port, at least three output ports, at least three switches, and a control logic input, the second signal multiplexer part of a second isolated power domain, the input port coupled with each output port via a switch, each switch being opened or closed according to signals received via the control port;

a first signal aggregator, including a first input port, at least a second input port, an output port, and circuitry to combine signals received on the input ports to one output signal on the output port, the first signal aggregator configured to have the first input port coupled with the first output port of the first signal multiplexer and to have the second input port coupled with the first output port of the second signal multiplexer, and the first signal aggregator is part of a third power domain;

a second signal aggregator, including a first input port, at least a second input port, an output port, and circuitry to combine signals received on the input ports to one output signal on the output port, the second signal aggregator configured to have the first input port coupled with the first output port of the second signal multiplexer and to have the second input port coupled with the first output port of the first signal multiplexer, and the second signal aggregator is part of a third power domain;

a first phase-locked loop module, including an input port, an output port, and circuitry to increase the frequency of a signal received on the input port and output a signal of increased frequency on the output port, the first phase-locked loop module configured to have the input port coupled with the output of the first signal aggregator and to be part of a fourth power domain;

a second phase-locked loop module, including an input port, an output port, and circuitry to increase the frequency of a signal received on the input port and output a signal of increased frequency on the output port, the second phase-locked loop module configured to have the input port coupled with the output of the second signal aggregator and to be part of a fifth power domain;

a first switching module, including an input port, a first output port, a second output port, a first switch, a second switch, and a control port, configured to have the input port connect to the first output port through the first switch, the input port connect to the second output port through the second switch, the state of each switch controlled by information received via the control port, and the input port coupled to the output port of the first phase-locked loop module, the third switching module part of the fourth power domain;

a second switching module, including an input port, a first output port, a second output port, a first switch, a second switch, and a control port, configured to have the input port connect to the first output port through the first switch, the input port connect to the second output port through the second switch, the state of each switch controlled by information received via the control port, and the input port coupled to the output port of the second phase-locked loop module, the fourth switching module part of the fifth power domain;

a third signal aggregator, including a first input port, at least a second input port, an output port, and circuitry to combine signals received on the input ports to one output signal on the output port, the third signal aggregator configured to have the first input port coupled with the first output port of the first switching module and to have the second input port coupled with the first output port of the second switching module, and the third signal aggregator is part of the third power domain; and a fourth signal aggregator, including a first input port, at least a second input port, an output port, and circuitry to combine signals received on the input ports to one output signal on the output port, the fourth signal aggregator configured to have the first input port coupled with the second output port of the second switching module and to have the second input port coupled with the second output port of the first switching module, and the fourth signal aggregator is part of the third power domain.

* * * * *